United States Patent [19]

Sankaranarayanan

[11] Patent Number: 5,134,453

[45] Date of Patent: Jul. 28, 1992

[54] BULK TRANSPORT CHARGE-COUPLED DEVICE WITH LINEAR INPUT CHARACTERISTIC

[75] Inventor: Lakshmi N. Sankaranarayanan, Eindhoven, Netherlands

[73] Assignee: U.S. Philips Corporation, New York, N.Y.

[21] Appl. No.: 650,533

[22] Filed: Feb. 5, 1991

[30] Foreign Application Priority Data

Feb. 8, 1990 [NL] Netherlands .................. 9000297

[51] Int. Cl.$^5$ .............................................. H01L 29/78
[52] U.S. Cl. ........................................ 357/24; 377/60;
377/61; 377/62; 377/63
[58] Field of Search ............... 357/24, 24 M; 377/60,
377/61, 62, 63

[56] References Cited

U.S. PATENT DOCUMENTS

| | | | |
|---|---|---|---|
| 4,796,071 | 1/1989 | Imaide | 357/24 M |
| 4,878,103 | 10/1989 | Cazaux et al. | 357/24 M |
| 4,949,143 | 8/1990 | Iesaka et al. | 357/24 M |

FOREIGN PATENT DOCUMENTS

| | | | |
|---|---|---|---|
| 0322303 | 6/1989 | European Pat. Off. | 357/24 M |
| 53-136976 | 11/1978 | Japan | 357/24 |
| 55-11305 | 1/1980 | Japan | 357/24 |
| 2054961 | 2/1981 | United Kingdom | 357/24 M |

*Primary Examiner*—William D. Larkins
*Assistant Examiner*—Ngan Van Ngo
*Attorney, Agent, or Firm*—Bernard Franzblau

[57] ABSTRACT

A charge-coupled device includes a semiconductor body (3) having a semiconductor layer (3) of a first conductivity type adjoining a surface and means for depleting the semiconductor layer throughout its thickness while avoiding breakdown. A sequence (row) of transport electrodes are provided on the surface above the semiconductor layer and are separated by a blocking (isolating) layer from the semiconductor layer and are connected to a clock voltage source to form in the semiconductor layer mutually separated potential wells for storing and transporting information-carrying charge packets. An input stage (I) has a supply zone for supplying majority charge carriers and an input electrode. The input electrode is located between the supply zone and the transport electrodes and is separated by the isolating layer from the semiconductor surface. An input signal source is provided along with means for forming under the input electrode a potential well whose minimum is located closer to the surface than are the potential wells under the transport electrodes. A dopant of the second opposite conductivity type is introduced between the supply zone and the transport electrodes in so that the net doping of the first conductivity type in the part (I) of the semiconductor layer between the supply zone and the transport electrodes is lower than in the remaining part of the layer.

Preferably, the width of the electrodes of the input stage (I) is chosen so that the transport capacity of these electrodes is practically equal to that of the transport electrodes.

12 Claims, 1 Drawing Sheet

BULK TRANSPORT CHARGE-COUPLED DEVICE WITH LINEAR INPUT CHARACTERISTIC

BACKGROUND OF THE INVENTION

This invention relates to a charge-coupled device having a semiconductor body comprising a semiconductor layer of a first conductivity type adjoining a surface, means for depleting the semiconductor layer throughout its thickness at least in the absence of the supply of majority charge carriers while avoiding breakdown, a sequence of transport electrodes on the surface above the semiconductor layer, which are separated from this layer by a blocking layer and are connected to clock voltage sources to form in the semiconductor layer potential wells separated from the surface for storing and transporting information-carrying charge packets, an input stage comprising a supply zone for supplying said majority charge carriers and an input electrode, which is located between the supply zone and the transport electrodes, is separated from the semiconductor surface by an isolating layer and by which in the semiconductor layer a potential well can be induced with an input signal source for applying a voltage difference between the supply zone and the input electrode, which determines the value of a charge carrier packet flowing from the supply zone into the potential well under the input electrode, while in order to obtain a practically linear relation between the value of the said charge carrier packet and the input signal, means are provided by which a potential well can be obtained under the input electrode whose minimum is located closer to the surface than in the potential wells induced under the transport electrodes.

Such a charge-coupled device is known from U.S. Pat. No. 4,280,068.

Charge-coupled devices with charge transport at a certain distance from the surface, so-called bulk transport, are well known and are designated by the abbreviations BCCD ("Buried Channel Charge-Coupled Device") and PCCD ("Peristaltic Charge-Coupled Device"). They are distinguished from analogue devices in which the charge transport takes place along the surface, inter alia, in that the transport efficiency is substantially not influenced by surface states. Moreover, in this device, the charge transport takes place under the influence of comparatively strong electrical fields because of the comparatively large distance between the charge packets and the transport electrodes. Devices of the BCCD type therefore generally operate at a very high speed.

It is desirable for most applications that the value of the charge packet to be formed under the input electrode varies practically linearly with the value of the input signal applied to the input electrode.

In charge-coupled devices of the BCCD type, however, potential wells are formed whose minimum is located at a certain distance from the semiconductor surface. With increasing value of the introduced charge packet, the stored charge always lies closer to the surface. The capacity of the charge storage space is therefore not constant, but increases with the value of the charge packet, so that upon conversion of the input signal into a charge packet a non-linearity is introduced. Therefore, attempts have been made to eliminate this undesired non-linearity in the input characteristic of such charge-coupled devices. For this purpose, it is suggested in the aforementioned U.S. Pat. No. 4,280,068 to generate under the input electrode a potential well whose minimum is located at a smaller distance from the surface than the minima of the potential wells generated under the transport electrodes. Due to the fact that it has been found that comparatively large quantities of charge can be stored closer to the surface without large capacity variations, in this manner a more linear input characteristic is obtained.

However, it has been found that also with the use of this measure in many cases the linearity of the input characteristic is nevertheless insufficient.

SUMMARY OF THE INVENTION

The invention has, inter alia, for its object to eliminate entirely or practically entirely the remaining non-linearity of the input characteristic in a charge-coupled device of the kind described.

The invention is based, inter alia, on the recognition of the fact that it is possible that by means of an additional doping or implantation step the input capacitance is determined practically entirely by the (linear) capacitance of the isolating layer under the input electrode.

According to the invention, a charge-coupled device of the kind described in the opening paragraph is characterized in that a dopant of the second opposite conductivity type is introduced between the supply zone and the transport electrodes in a manner such that the net doping of the first conductivity type in the part of the semiconductor layer between the supply zone and the transport electrodes is lower than in the remaining part of the layer.

The input characteristic of a charge-coupled device according to the invention has a greatly improved linearity. This is due to the lower net doping of the semiconductor layer under the input electrode. The charge packet introduced via this electrode is taken up for the major part by the capacitance formed by the isolating layer. However, a small part of the charge is taken up by the part of the semiconductor layer located under the input electrode.

This remaining charge part, which causes the non-linearity, is reduced considerably in the charge-coupled device according to the invention due to the reduced net doping of said semiconductor region so that the input capacitance is determined practically entirely by the linear capacitance of the isolating layer.

Since the input stage is designed to operate in the accumulation mode, that is to say that the induced charge is stored at least for an important part near the surface, the charge transport capacity per unit of electrode width will be larger than at the transport electrodes. Therefore, the width of the electrodes of the input stage is therefore chosen so that the transport capacity of these electrodes is practically equal to that of the transport electrodes. Advantageously, the net doping of the semiconductor layer under the input electrode is chosen so that in the operating condition, due to the difference in threshold voltage between the input electrode and the transport electrodes, an additional electrical field is obtained in the transport direction.

In many cases, a sampling electrode is provided advantageously between the supply zone and the input electrode for sampling the input signal, this sampling electrode being provided with means by which during sampling a potential can be applied in the semiconductor layer, by which the supply of majority charge carriers from the supply zone to the input electrode can be blocked.

BRIEF DESCRIPTION OF THE DRAWING

The invention will now be described more fully with reference to an embodiment shown in the drawing, in which.

DESCRIPTION OF THE PREFERRED EMBODIMENTS

Figure 1:
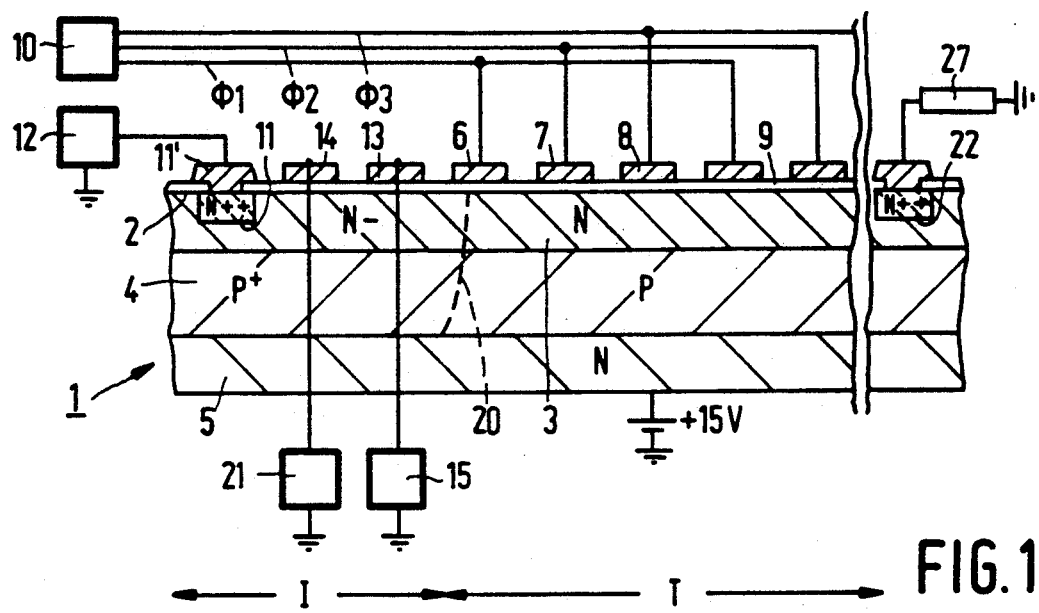
FIG. 1 shows diagrammatically in cross-section a charge-coupled device according to the invention.

The Figures are purely schematic and not drawn to scale, while for the sake of clarity especially the dimensions in the direction of thickness are exaggerated. In the cross-sections, semiconductor regions of the same conductivity type are generally cross-hatched in the same direction. Corresponding parts are generally designated in the different Figures by the same reference numerals.

FIG. 1 shows diagrammatically in cross-section an embodiment of a charge-coupled device according to the invention. The device according to this embodiment is intended to be used for image transport, but the invention may also be used in other charge-coupled devices. The device comprises a semiconductor body 1 made in this embodiment of silicon and having a semiconductor layer 3 of the first conductivity type, which adjoins a surface 2 and in which the charge transport takes place.

In this embodiment, the layer 3 consists of n-type silicon. The thickness and the doping concentration of the layer 3 are so small that the layer 3 — at least in the absence of the supply of majority charge carriers — can be depleted throughout its thickness without a breakdown occurring. The layer 3 is formed in this embodiment by an implantation of phosphorus ions at a dose of $1.18 \cdot 10^{12}$ ions/cm$^2$ and at an energy of 100 keV. The layer 3 has a thickness of 1.08 $\mu$m and is bounded in this embodiment on its lower side by a p-type layer 4, which forms a p-n junction with the layer 3. The layer 4 is formed by an implantation of boron ions down to a depth of 3.8 $\mu$m at a dose of $9.0 \cdot 10^{11}$ ions/cm$^2$ at an energy of 90 keV. The layer 4 is bounded on the lower side by an n-type substrate 5.

It should be noted that the p-type layer 4 and the n-type substrate 5 are not essential to the invention. The layer 3 may be provided instead, for example, on an isolating substrate.

A sequence or row of transport electrodes 6, 7, 8 are provided on the surface above the semiconductor layer 3, which transport electrodes are constituted by conducting strips of, for example, metal or doped semiconductor material, such as polycrystalline silicon, and are separated by a blocking layer 9 from the layer 3. The blocking layer 9 is constituted in this embodiment by an isolating layer of silicon oxide. However, instead, if desired, a metal-semiconductor junction (Schottky junction) or a layer of another isolating material, such as, for example, silicon nitride, could also be used as a blocking layer.

Figure 3:
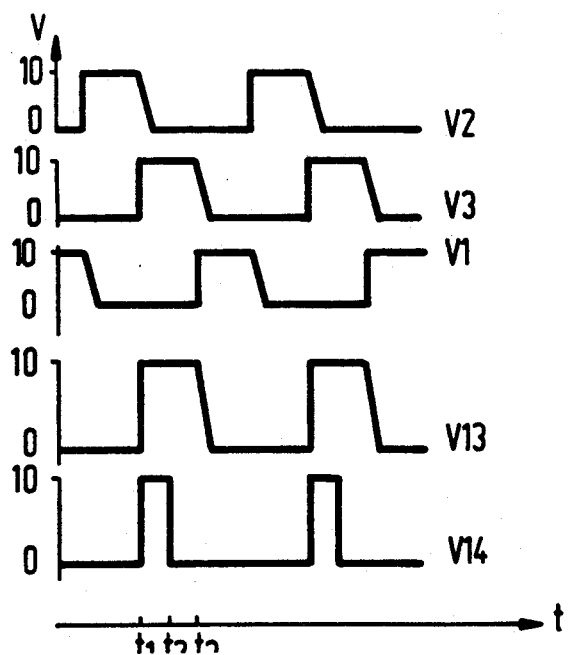
FIG. 3 shows the variation with time of the clock voltages to be applied to the electrodes.

The transport electrodes 6, 7, 8 are connected via clock lines $\phi 1$, $\phi 2$ and $\phi 3$ to the clock voltage source 10. FIG. 3 indicates by way of example how the clock voltages V1, V2 and V3 at the clock lines $\phi 1$, $\phi 2$ and $\phi 3$ can vary as a function of the time t. By means of these clock voltages, as is known, a moving pattern of potential wells can be induced in the layer 3, which potential wells are mutually separated by potential barriers and serve for storing and transporting information-carrying charge packets.

The charge is introduced via an input stage I (see FIG. 1), which is separated from the transport section T and comprises a supply zone 11 for supplying majority charge carriers, which in this embodiment are electrons, of which the charge packets are composed. The supply zone is constituted in this embodiment by a highly doped n-type zone 11. This zone 11 is connected to a voltage source 12, which supplies to the supply zone 11 an input signal, which is to be converted into a charge packet.

The input stage I further comprises an input electrode 13 located between the supply zone 11 and the transport electrodes 6, 7, 8 and separated by the isolating layer 9 from the semiconductor surface 2. By means of a voltage V13 applied to the input electrode 13, a potential well can be induced in the semiconductor layer 3, from which a charge packet is formed corresponding to the value of the input signal at the supply zone 11.

In this embodiment, a further sampling electrode 14 is provided for sampling the input signal between the supply zone 11 and the input electrode 13, by which electrode the supply of electrons from the supply zone 11 to the input electrode 13 can be interrupted.

An input signal source 12 (see FIG. 1) is connected to the supply zone 11 for applying a voltage difference between the supply zone 11 and the input electrode 13, which voltage difference determines the size of a charge carrier packet, so in this case a packet of electrons, which flows from the supply zone 11 into the potential well under the input electrode 13.

Since in charge-coupled devices of this kind, in which the charge carrier transport takes place in the interior of the semiconductor layer 3, the capacitances between the electrodes and the charge storage sites generally vary with the quantity of stored charge, the input characteristic (value of the charge packet as a function of the value of the input signal) is generally non-linear. In the device described here, (switching) means 15 are therefore provided by which a potential well can be obtained under the input electrode 13 whose minimum is located closer to the surface than in the potential wells induced under the transport electrodes so that the input capacitance is much less dependent upon the stored charge.

According to the invention, a dopant of the second (so in this case p) conductivity type is further introduced between the supply zone 11 and the transport electrodes (6, 7, 8) in a manner such that the net doping of the first (n) conductivity type in the part of the semiconductor layer 3 bounded by the dotted line 20 between the supply zone 11 and the transport electrodes 6, 7, 8 is lower than in the remaining part of the layer 3. In the present embodiment, this additional p-doping was obtained by a second implantation of boron ions down to a depth of 4.0 $\mu$m at a dose of $1.1 \cdot 10^{12}$ ions/cm$^2$ at an energy of 90 keV.

Due to the fact that a potential well with a potential maximum near the surface 2 is formed under the input electrode 13, the charge packet introduced via the electrode 13 is taken up for the major part by the capacitance constituted by the isolating layer 9.

This effect is increased additionally by the measure according to the invention. Due to the fact that in the device according to the invention the n-doping of the layer 3 is reduced under the input electrode 13, much less charge can be received therein than in the transport section T of the layer 3. As a result, practically the whole charge packet under the input electrode is taken up by the linear input capacitance of the isolating layer 9.

Figure 2:
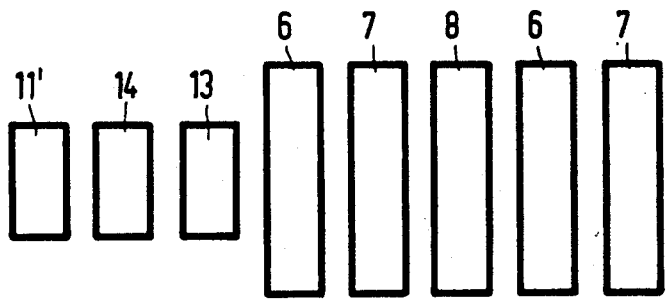
FIG. 2 shows diagrammatically in plan view a part of the electrode structure of the device shown in FIG. 1.

FIG. 2 shows diagrammatically in plan view the transport electrodes 6, 7, 8 and the electrodes 11', 13 and 14 of the input stage I. It can be seen therefrom that the width of the electrodes 11', 13 and 14 of the input stage is smaller than that of the transport electrodes 6, 7 and 8. Due to the fact that the charge transport capacity of the electrodes of the input stage, in which the charge is stored at least for the major part at the surface, is higher per unit of electrode width than that of the transport electrodes, in fact the width of the electrodes of the input stage is preferably chosen so that the transport capacity of the electrodes in the input section and in the transport section is practically the same.

The operation of the device will now be described more fully by way of example. The various dopings, voltages etc. are given only by way of example. Within the scope of the invention, a person skilled in the art will choose for each practical case the parameters suitable for an optimum operation of the device.

As indicated in FIG. 1, the substrate 5 is connected to a voltage of, for example, +15 V with respect to ground. Via the output zone 22, a direct voltage of, for example, 20 V is applied to the layer 3. At a voltage of 0 V of the transport electrodes 6, 7, 8 and the electrodes 13, 14 of the input section I, the layer 3 can be depleted throughout its thickness, at least under these electrodes.

As indicated in FIG. 3, the clock voltages V1, V2 and V3 vary between 0 and 10 V. When a transport electrode 6, 7 or 8 is connected to 10 V, a potential well is formed under this electrode, whose potential maximum is located at a comparatively great depth in the layer 3 and in which electrons can be stored. At a voltage of 0 V at the electrode, any stored electrons are transferred to an adjacent site of higher potential. Between two successive potential wells, a potential barrier is formed by the intermediate electrode, which mutually separates the potential wells.

The input electrode 13 is connected to the voltage source 15, which supplies a voltage V13 (see FIG. 3). This voltage V13 varies between a lowest level, which is practically equal to the lowest level of the clock voltages V1, V2, V3, and a highest level. The highest level of V13, at which charge is stored under the electrode 13, in this example 10 V, is situated so that it is higher than the voltage at the supply zone 11, which latter voltage is higher than the lowest potential under the transport electrode 6.

According to the invention, moreover the doping of the layer 3 under the electrode 13 is considerably reduced so that in situ very little charge can be stored in the layer 3. As a result, the charge carriers stored in this potential well will practically all be accumulated in the capacitance between the layer 3 on the one hand and the electrode 13 on the other hand. As a result, the linearity between the input signal and the output current is considerably improved. In the embodiment described, this linearity was about 99% and thus was practically equal to that of so-called surface CCD's.

The boron implantations in this embodiment are chosen so that, due to the difference in threshold voltage between the input electrode 13 and the transport electrodes 6, 7, 8, in the operating condition an electrical field is obtained in the transport direction, which favours the speed of operation of the device.

In this embodiment, during sampling of the input signal, a voltage V14 is applied in the time interval between t1 and t2 (see FIG. 3) by means of the voltage source 21, which voltage is equal to the voltage at the electrode 13 so that no potential thresholds are present between the supply zone 11 and the input electrode 13. At the instant t2, the voltage V14 falls to 0 V. As a result, the said connection is interrupted by the potential barrier under the sampling electrode 14.

At the instant t3, the voltage at the input electrode 13 falls to 0 V and a voltage V1 of 10 V is applied to the electrode 6. The charge packet under the electrode 13 is thus transported to the potential well formed under the electrode 6. In the usual manner for charge-coupled devices of the BCCD type, the said packet is transported further by means of the clock voltages V1, V2 and V3 via the bulk of the layer 3 to the output 22, at which the information is read out by means of a readout member 27.

The invention is not limited to the embodiment described here. Within the scope of the invention defined in the claims, many variations are possible for those skilled in the art.

For example, the various dopings not only may have different values, but their signs may also be inverted (simultaneously) with simultaneous reversal of the voltages applied. Further, the layers 3 and 4 may also be formed, for example, by diffusion or epitaxially instead of by ion implantation. Moreover, the introduction of the dopant of the second conductivity type according to the invention may take place, instead of by implantation, also in a different manner, for example by diffusion or by a combination of implantation and diffusion. Other embodiments of charge-coupled devices in which the invention may advantageously be used are described, for example, in the aforementioned U.S. Pat. No. 4,280,068, whose contents are hereby incorporated by reference in the present Application.

I claim:

1. A charge coupled device comprising: a semiconductor body including a semiconductor layer of a first conductivity type adjoining a surface thereof, means for depleting the semiconductor layer throughout its thickness at least in the absence of a supply of majority charge carriers while avoiding breakdown, a sequence of transport electrodes on the surface above the semiconductor layer and separated from said layer by a isolating layer, said transport electrodes being connected to clock voltage sources to form in the semiconductor layer potential wells, separated from the surface, for storing and transporting information-carrying charge packets, an input stage comprising a supply zone for supplying said majority charge carriers and an input electrode which is located between the supply zone and the transport electrodes and which is separated from the semiconductor surface by said isolating layer, whereby a potential well can be induced in the semiconductor layer by means of an input signal source for applying a voltage difference between the supply zone and the input electrode which determines the size of a charge carrier packet flowing from the supply zone into the potential well under the input electrode, means for forming said potential well under the input electrode whereby the minimum of the potential well is located closer to the surface than the potential wells induced under the transport electrodes, characterized in that a dopant of a second conductivity type is included in a part of the semiconductor layer between the supply zone and the transport electrodes such that the net doping of the first conductivity type in said part of the semiconductor layer is lower than in the remaining part of the semiconductor layer.

2. A charge-coupled device as claimed in claim 1, wherein the electrodes of the input stage have a width chosen so that said electrodes have a transport capacity which is substantially equal to that of the transport electrodes.

3. A charge-coupled device as claimed in claim 2 wherein the net doping of the semiconductor layer under the input electrode is chosen so that, due to a difference in threshold voltage between the input electrode and the transport electrodes, an additional electrical field is produced in the transport direction.

4. A charge-coupled device as claimed in claim 2 wherein a sampling electrode is provided between the supply zone and the input electrode for sampling the input signal, said sampling electrode having means for applying, during sampling, a potential to the semiconductor layer of a value to block the supply of majority charge carriers from the supply zone to the input electrode.

5. A charge-coupled device as claimed in claim 1 wherein the net doping of the semiconductor layer under the input electrode is chosen so that, due to a difference in threshold voltage between the input electrode and the transport electrodes, an additional electrical field is produced in the transport direction.

6. A charge-coupled device as claimed in claim 5 wherein a sampling electrode is provided between the supply zone and the input electrode for sampling the input signal, said sampling electrode having means for applying, during sampling, a potential to the semiconductor layer of a value to block the supply of majority charge carriers from the supply zone to the input electrode.

7. A charge-coupled device as claimed in claim 1 wherein a sampling electrode is provided between the supply zone and the input electrode for sampling the input signal, said sampling electrode having means for applying, during sampling, a potential to the semiconductor layer of a value to block the supply of majority charge carriers from the supply zone to the input electrode.

8. A bulk channel charge-coupled device comprising:
a semiconductor body including a semiconductor layer of a first conductivity type at a surface thereof, wherein said semiconductor layer, at least in the absence of a supply of majority charge carriers, can be depleted throughout its thickness without a breakdown,
an isolating layer on a surface of the semiconductor layer,
a series of transport electrodes on a surface of said isolating layer,
a clock voltage source coupled to the transport electrodes to cyclically induce potential wells in the semiconductor layer and spaced from the surface of the semiconductor layer thereby to store and transport information-carrying charge packets,
an input stage comprising a supply zone for supplying said majority charge carriers and an input electrode which is located between the supply zone and the transport electrodes and which is separated from the semiconductor surface by the isolating layer,
an input signal source for supplying a voltage between the supply zone and the input electrode which determines the size of a charge carrier packet flowing from the supply zone into a potential well under the input electrode,
means for applying a voltage to the input electrode so as to induce a potential well in said semiconductor layer below the input electrode such that a minimum of said potential well is located closer to the surface than are the potential wells induced in the semiconductor layer under the transport electrodes, and wherein
a part of the semiconductor layer located between the supply zone and the transport electrodes includes a dopant of opposite conductivity type to said first conductivity type whereby the net doping of the first conductivity type in said part of the semiconductor layer is lower than in the remaining part of the semiconductor layer thereby to improve the linearity of the input characteristic of said device.

9. A charge-coupled device as claimed in claim 8 wherein the input stage further comprises a signal electrode over the semiconductor layer and adjacent the supply zone for applying an input signal voltage thereto, and wherein
the input stage electrodes have a width such that said electrodes have a transport capacity substantially equal to that of the transport electrodes.

10. A charge-coupled device as claimed in claim 8 wherein the net doping of the semiconductor layer under the input electrode produces an electric field in the charge transport direction in the presence of a voltage between the input electrode and the transport electrodes.

11. A charge-coupled device as claimed in claim 8 further comprising a sampling electrode on the surface over the semiconductor layer and between the supply zone and the input electrode, and
means including the sampling electrode for applying a sampling voltage to the semiconductor layer during sampling of an input signal and of a value sufficient to block the flow of majority charge carriers from the supply zone to the input electrode.

12. A charge-coupled device as claimed in claim 11 wherein said sampling voltage is at most equal to the voltage in the potential well under the input electrode.

* * * * *